US006931122B2

(12) United States Patent
Sabouri et al.

(10) Patent No.: US 6,931,122 B2
(45) Date of Patent: Aug. 16, 2005

(54) SINGLE TRANSFORMER HYBRID SYSTEM AND METHOD

(75) Inventors: Faramarz Sabouri, Lawrenceville, NJ (US); Ali Ghahary, Bridgewater, NJ (US)

(73) Assignee: Analog Devices, Inc., Norwood, MA (US)

( * ) Notice: Subject to any disclaimer, the term of this patent is extended or adjusted under 35 U.S.C. 154(b) by 149 days.

(21) Appl. No.: 10/649,224

(22) Filed: Aug. 26, 2003

(65) Prior Publication Data
US 2004/0151302 A1 Aug. 5, 2004

Related U.S. Application Data
(60) Provisional application No. 60/445,022, filed on Feb. 5, 2003.

(51) Int. Cl.[7] .................................. H04M 9/08
(52) U.S. Cl. ................... 379/402; 379/390.04; 379/394
(58) Field of Search .................. 379/387.01, 390.04, 379/394, 402

(56) References Cited

U.S. PATENT DOCUMENTS

| 5,271,060 | A | 12/1993 | Moran, III et al. |
| 5,426,697 | A | 6/1995 | McGrane |
| 5,541,990 | A | 7/1996 | Rahamim |
| 5,602,912 | A | 2/1997 | Hershbarger |
| 6,351,185 | B1 | 2/2002 | Amrany et al. |
| 6,804,349 | B1 * | 10/2004 | Prat et al. ................ 379/402 |
| 2001/0021250 | A1 * | 9/2001 | Vanderbauwhede et al. ..... 379/402 |
| 2002/0126835 | A1 | 9/2002 | Joffe |

FOREIGN PATENT DOCUMENTS

| EP | 1 107 464 | 12/1999 |
| EP | 1 081 874 | 3/2001 |
| JP | 2002335193 | 11/2002 |
| WO | WO 98/43385 | 10/1998 |

* cited by examiner

*Primary Examiner*—Jefferey Harold
(74) *Attorney, Agent, or Firm*—Gauthier & Connors LLP

(57) ABSTRACT

A hybrid matching system is disclosed for use with a transmitter and receiver. The hybrid matching system includes a pair of transmitter output nodes, a pair of receiver input nodes, and a pair of terminals for interfacing to a transmission line. The system further includes a first impedance bridge portion including at least one inductor for coupling to the transmission line terminals via at least one transformer winding, and a second impedance bridge portion interposed between the pair of transmitter output nodes and the first impedance bridge portion, and interposed between the pair of receiver input nodes and the first impedance bridge portion.

15 Claims, 3 Drawing Sheets

SINGLE TRANSFORMER HYBRID SYSTEM AND METHOD

PRIORITY

This application claims priority to U.S. Provisional Patent Application Ser. No. 60/445,022 filed Feb. 5, 2003.

BACKGROUND

The invention generally relates to transformer systems, and relates in particular to transformer hybrid systems for use with modem systems.

Many modem systems include a hybrid matching network to facilitate the transmission of a signal, to permit reception of a signal with reduced attenuation, and to reduce interference from the signal transmission path into the signal reception path. The hybrid matching network provides the interface between the modem circuit and the transmission line, e.g., the tip and ring of the telephone network. The hybrid network, therefore, must properly terminate the transmission line.

In particular, many conventional hybrid networks employ a transformer to provide the required isolation barriers between sensitive electronic circuitry and the telephone line. This transformer is also used to step the transmit (TX) voltage up or down depending on the application. The hybrid network may also properly accept the receive (RX) signal while keeping the TX signal from entering the RX path and contaminating the RX signal (e.g., with an echo signal).

As shown in FIG. 1, a conventional hybrid matching network may include a pair of transmit differential signal nodes 10, 12, a pair of receive differential signal nodes 14, 16, and transmit line differential signal nodes 18, 20 for coupling to the tip and ring of a telephone network. The circuit also includes a balanced Wheatstone bridge including windings (N1) 22, 24 on the integrated circuit side and impedances (Zm) 26, 28 and further includes windings (N2) 30, 32 on the line side. Ideally, impedances (Zm) 26, 28 are chosen to be identical to the reflected line impedances as seen through the N1 windings. Half of the TX signal, therefore, is dropped across each of the N1 windings. The total voltage across the two N2 windings is the TX signal multiplied by the turns ratio N2/N1. The turns ratio may, therefore, be used to control any stepping up or down of the TX signal.

The transmit differential signal nodes 10, 12 should effectively appear to be ground to the RX signal. Each of the N1 windings sees half of the RX signal reflected by the turns ratio. The complete reflected RX signal, therefore, appears at the receive differential signal nodes 14, 16.

The interference rejection (echo rejection) is achieved by employing a balanced bridge such that no component of the TX signal appears at the receive differential signal nodes 14, 16. The closer that the impedance Zm is matched to the line impedance reflected through the N1 windings, the better the circuit will provide echo rejection. The telephone line may typically be modeled with an RC circuit, although it is sometimes helpful to also include an inductor in Zm to match the effect of the transformer inductance. The use of inductors in the matching network, however, is not generally desired due to their size, cost and/or noise sensitivity. The matching impedance Zm, therefore, is typically implemented using only resistors and capacitors, and the hybrid matching is typically optimized for a specific desired frequency range.

In certain applications, the swing range of the TX signal may not be large enough to provide the desired voltage to nodes 18 and 20. If a transformer is used to step the TX voltage up on the line side, then the value of the capacitors in Zm may become too large and/or expensive. For example, a three-fold increase in the turns ratio (e.g., from 1:1 to 1:3) may require a nine fold increase in the size of the required capacitance in Zm.

There is a need, therefore, for more efficient and cost effective implementation of a hybrid matching network.

SUMMARY OF THE INVENTION

In accordance with an embodiment, the invention provides a hybrid matching system for use with a transmitter and receiver. The hybrid matching system includes a pair of transmitter output nodes, a pair of receiver input nodes, and a pair of line terminals for communication with the transmission line. The system further includes a first impedance bridge portion including at least one inductor for coupling to the line terminals via at least one transformer winding, and a second impedance bridge portion interposed between the pair of transmitter output nodes and the first impedance bridge portion, and interposed between the pair of receiver input nodes and the first impedance bridge portion

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

Figure 2:
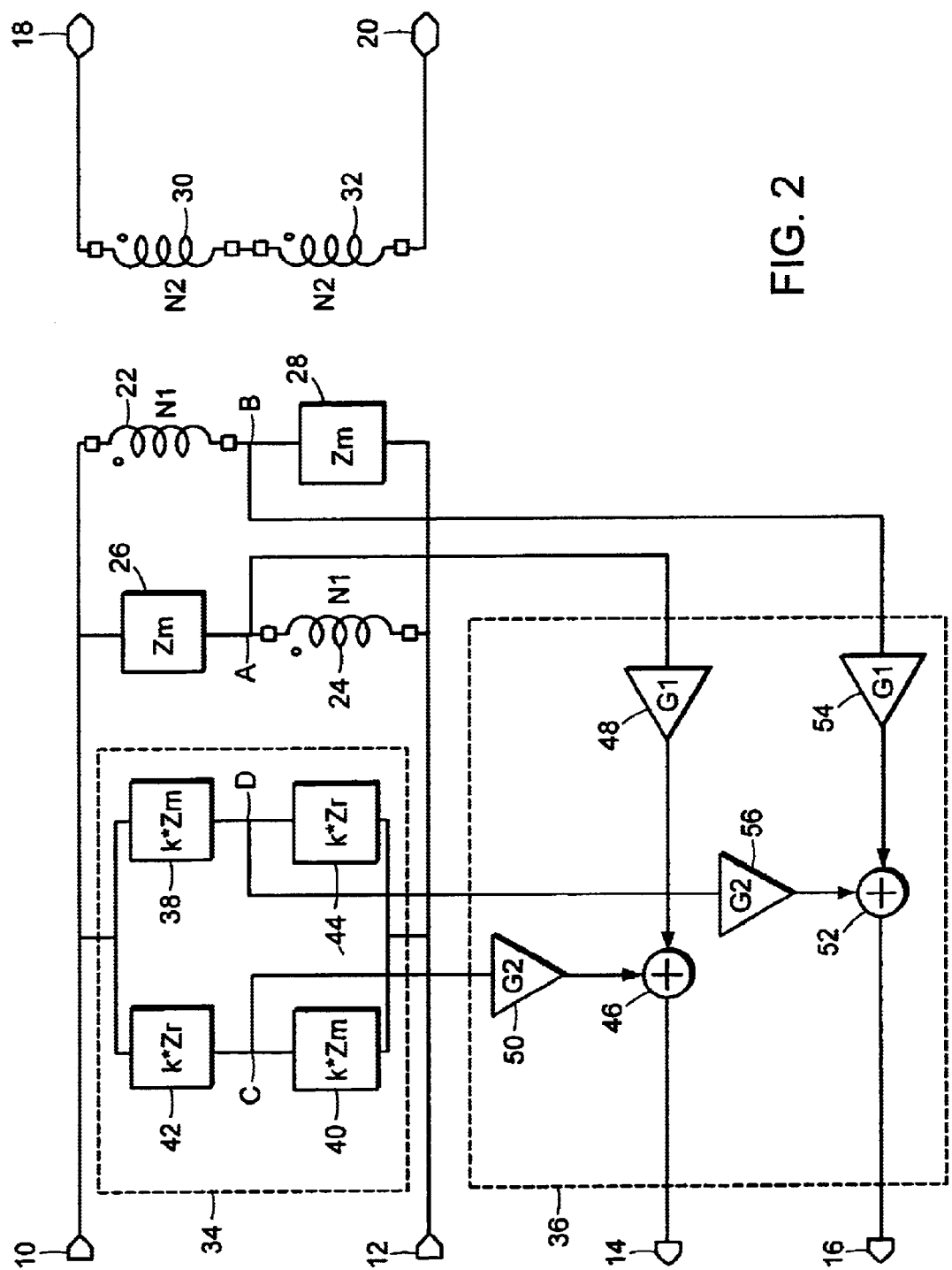
FIG. 2 shows a diagrammatic illustrative view of transformer bridge hybrid circuit in accordance with an embodiment of the invention.

As shown in FIG. 2, a hybrid matching network in accordance with an embodiment of the invention further includes a supplemental matching network 34 and a receive path coupling network 36. In the embodiment shown, the supplemental matching network 34 includes a pair of impedances (38, 40) of value kZm and a pair of impedances (42, 44) of value kZr, where Zr is the reflected line impedance to each primary winding of the transformer. The receive path coupling network 36 includes a first summer 46 that is coupled to a node A in the main bridge via an amplifier 48 (having a gain of G1) and is coupled to a node C in the supplemental bridge via an amplifier 40 (having a gain of G2). The receive path coupling network 36 further includes a second summer 52 that is coupled to a node B in the main bridge via an amplifier 54 (having a gain of G1) and is coupled to a node D in the supplemental bridge via an amplifier 56 (having a gain of G2). The outputs of the summers 46, 52 provide the differential receive signal at nodes 14 and 16 respectively.

In this new scheme, the impedance Zm is not required to be an exact match of the reflected line impedance, and the bridge that includes the N1 transformer windings is not required to cancel the entire TX signal. The impedance Zm may simply be a termination impedance for the transmission line. For the echo rejection, the supplemental matching network 34 is employed, and its signal is added to the signal of the main bridge. In the embodiment shown in FIG. 2, the supplemental bridge has the same impedances that exist in the main bridge, with Zr being the same as the reflected impedance seen through N1. The phasing of the bridge signals is chosen such that they are equal and opposite of each other.

The voltage difference between the voltages at node A and node B ($V_{AB}$) will be equal to the negative of the voltage difference between the voltages at node C and node D ($V_{CD}$), i.e., $V_{AB}=-V_{CD}$, and adding the two bridge outputs together (with G1=G2) will provide sufficient echo rejection. In fact, for $V_{AB}$ ad $V_{CD}$ to have the same magnitude, the impedances in the 4 branches of the supplemental bridge need only be scaled versions of the corresponding branches of the main bridge. This means that the factor k may have a range of values, and there exists considerable freedom in choosing components that provide the impedances Zm, kZm and kZr. In a general form, the four impedances in the supplemental bridge may be any value as long as $V_{CD}$ is a scaled replica of $V_{AB}$ but with opposite polarity. The gains G1 and G2 may then be chosen to cancel the outputs of the two bridges.

Figure 3:
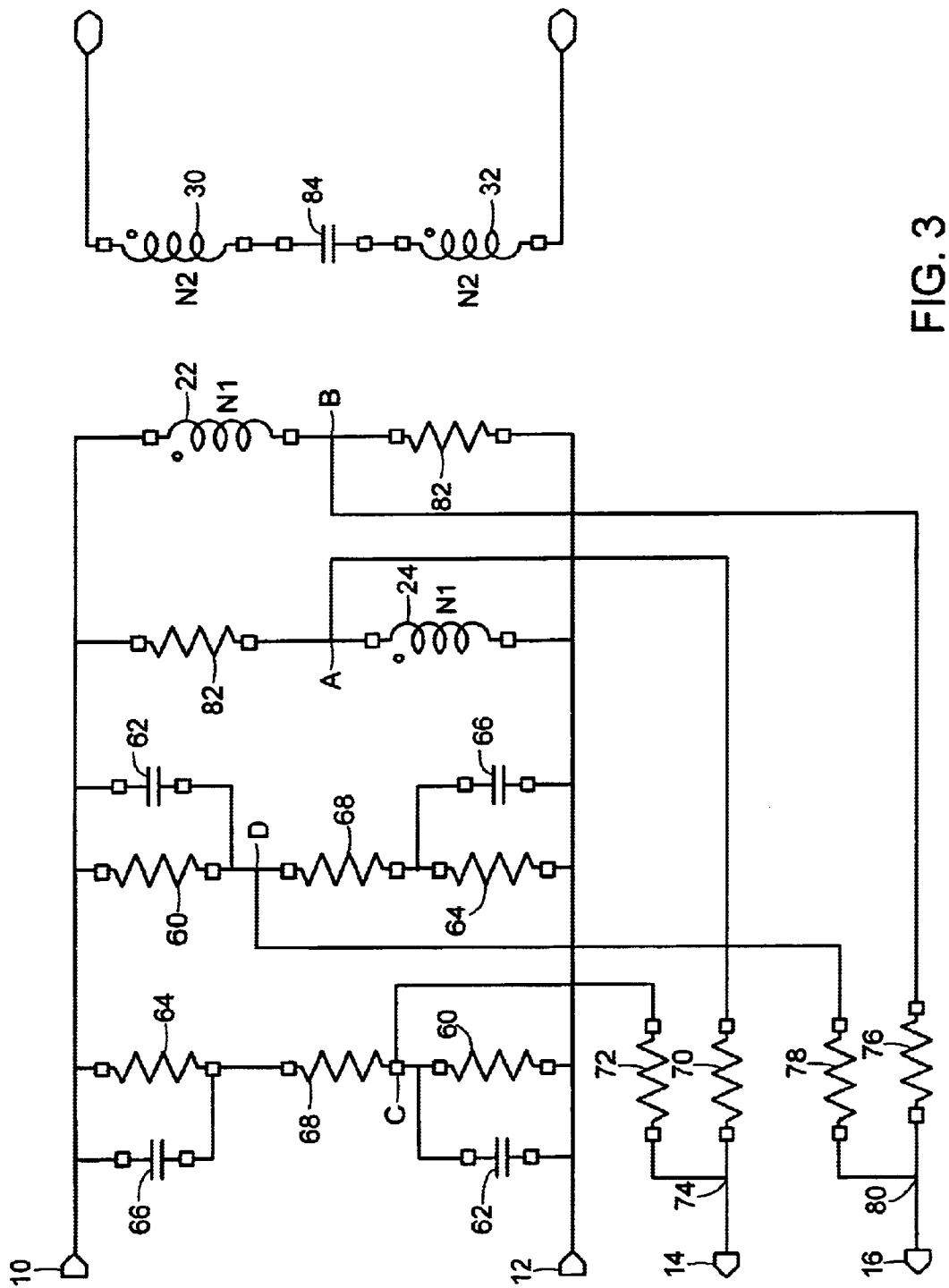
FIG. 3 shows a diagrammatic illustrative view of transformer bridge hybrid circuit in accordance with another embodiment of the invention.

For example, as shown in FIG. 3, a specific implementation of an embodiment of the invention may include the use of a combination of resistors and capacitors for the impedances 38, 40, 42 and 44. In particular, the impedances 38 and 40 may each include a resistor 60 (e.g., having a value of 24.9 Ω) in parallel with a capacitor 62 (e.g., having a value of 1.5 nF). The impedances 42 and 44 may each include a resistor 64 (e.g., having a value of 1.91 kΩ) in parallel with a capacitor 66 (e.g., having a value of 33 nF), each of which is also in series with another resistor 68 (e.g., having a value of 27.4 Ω).

The two bridge outputs may be added to one another in a variety of ways. The receive path coupling network for the positive receive differential signal node 14 includes a resistor 70 (e.g., having a value of 50 Ω) that is coupled to node A in the main bridge, and a resistor 72 (e.g., having an value of 100 Ω) that is coupled to node C in the supplemental bridge. The signals from each resistor 70 and 72 are combined (or summed) at node 74 as shown. The receive path coupling network for the negative receive differential signal node 16 includes a resistor 76 (e.g., having an value of 50 Ω) that is coupled to node B in the main bridge, and a resistor 78 (e.g., having an value of 100 Ω) that is coupled to node D in the supplemental bridge. The signals from each resistor 76 and 78 are combined (or mixed) at node 80 as shown. The receive path signals are added, therefore, using summing resistors. This leads to RX signal attenuation by a factor of ⅔ in that the points 14 and 16 provide a resistor-divided version of the full RX signal. The circuit in the supplemental bridge has been designed such that the magnitude of $V_{CD}$ due to the Tx signal is about two times the magnitude of $V_{AB}$ due to the Tx signal. The resistors 72, 78 that carry the output of the supplemental bridge are twice as large as the resistors 70, 72 that carry the output of the main bridge, and the RX signal attenuation is, therefore, decreased. Because resistors are used in this embodiment for the gains G1 and G2, these paths are frequency independent. In other embodiments, any combination of amplifiers, resistors, capacitors and/or inductors may be used to achieve a variety of characteristics of these receive signal networks.

Figure 1:
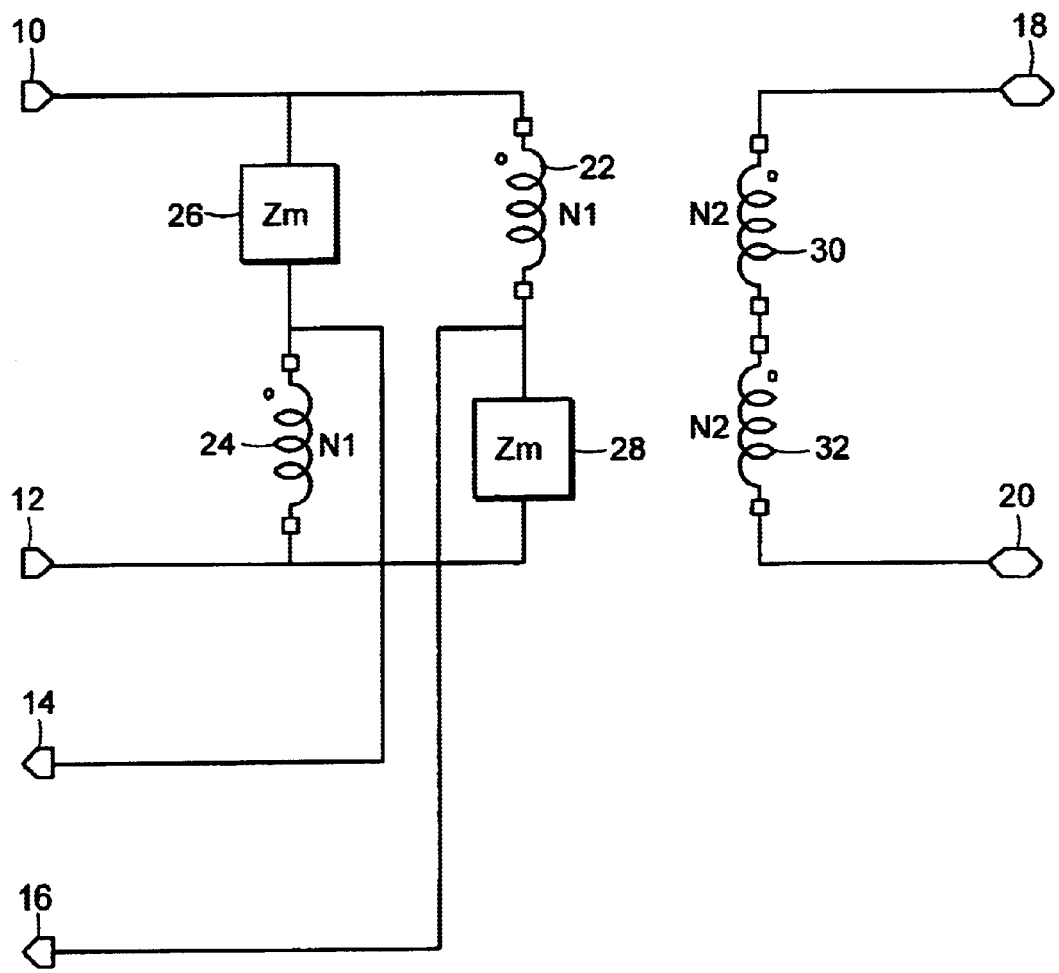
FIG. 1 shows a diagrammatic illustrative view of transformer bridge hybrid circuit of the prior art.

The impedances 26, 28 may be chosen to be simply resistors 82. By making the Zm blocks resistive rather than complex (resistive/capacitive/inductive), more power maybe transferred to the tip (18) and ring (20) for a given TX signal strength. An additional capacitor 84 may be employed between the N2 windings 30, 32 as required in various applications to block DC signals. The impedances in the supplemental bridge have been optimized above to achieve efficient hybrid rejection while eliminating inductors and minimizing capacitor values. The total value of capacitance of each leg of the supplemental bridge above is only 34.5 nF, whereas the total value of capacitance for a comparable circuit of FIG. 1 may be more than tens times larger (e.g., 370 nF).

Those skilled in the art will appreciate that numerous modifications and variations may be made to the above disclosed embodiments without departing from the spirit and scope of the invention.

What is claimed is:

1. A hybrid matching system for use with a transmitter and receiver, said hybrid matching system comprising:
   a pair of transmitter output nodes for providing a differential transmitter signal for transmission;
   a pair of receiver input nodes for receiving a differential received signal;
   a pair of line terminals to interface with a transmission line;
   an impedance bridge network for coupling said transmitter output nodes to said line nodes via at least one transformer winding; and
   a supplemental network interposed between said pair of transmitter output nodes and said impedance bridge network, and interposed between said pair of receiver input nodes and said impedance bridge network, said supplemental network including a bridge network.

2. The hybrid matching system as claimed in claim 1, wherein said supplemental network includes a transmitter path network and a receive path network.

3. The hybrid matching system as claimed in claim 1, wherein said supplemental network includes a bridge formed by a first pair of impedance units and a second pair of impedance units with said bridge being formed by one of each of said pairs of impedance units being in series with one of the other of each of said pairs of impedance units.

4. The hybrid matching system as claimed in claim 3, wherein said first pair of impedance matching units have an impedance value that is equal to one another, and said second pair of impedance matching units have an impedance value that is equal to one another.

5. The hybrid matching system as claimed in claim 3, wherein at least one of said first and second pairs of impedance matching units includes resistive and capacitive values.

6. The hybrid matching system as claimed in claim 1, wherein said impedance bridge network does not include a capacitor.

7. The hybrid matching system as claimed in claim 2, wherein said receive path network includes attenuation means for attenuating the receive signal to a desired value.

8. The hybrid matching system as claimed in claim 7, wherein said attenuation means is frequency independent.

9. The hybrid matching system as claimed in claim 7, wherein said attenuation means includes a summing stage.

10. A hybrid matching system for use with a transmitter and receiver, said hybrid matching system comprising:
    a line impedance network for coupling a pair of transmitter output nodes to a pair of transmission line nodes via at least one transformer winding for communication with a transmission line, and including at least one line impedance unit having a value Zm;

a supplemental matching network interposed between said line impendence network and a pair of transmit output nodes, said supplemental matching network including at least one supplemental impedance unit having a value kZm; and a receive path coupling network interposed between said line impedance network and a pair of receive input node.

11. The hybrid matching system as claimed in claim 10, wherein Zm has a resistive value only.

12. The hybrid matching system as claimed in claim 10, wherein said receive path coupling network is frequency independent.

13. The hybrid matching system as claimed in claim 10, wherein said line impedance bridge portion does not include a capacitor.

14. A hybrid matching system for use with a transmitter and receiver, said hybrid matching system comprising:

a line impedance network including at least one inductor for coupling via at least one transformer winding to a pair of line nodes for communication with a transmission line, and for coupling via a pair of receive signal nodes (A, B) to a receive path network;

a two-port network interposed between said line impendence network and a pair of transmitter output nodes, said two-port network for coupling via a pair of cancellation nodes (C, D) to said receive path network; and said receive path network coupled to said receive signal nodes (A, B) of said line impedance network, coupled to said cancellation nodes (C, D) of said two-port network and coupled to a pair of receiver input nodes for providing a differential receiver input signal to reduce echo from said transmitter output nodes from being present at said receiver input nodes.

15. The hybrid matching system as claimed in claim 14, wherein said line impedance network includes a line impedance unit having a value of Zm, and said two-port network includes a supplemental impedance unit having a value of kZm.

* * * * *